US006570520B2

(12) United States Patent
Ishii

(10) Patent No.: US 6,570,520 B2
(45) Date of Patent: May 27, 2003

(54) DA CONVERTER

(75) Inventor: Hirotomo Ishii, Kamakura (JP)

(73) Assignee: Kabushiki Kaisha Toshiba (JP)

( * ) Notice: Subject to any disclaimer, the term of this patent is extended or adjusted under 35 U.S.C. 154(b) by 0 days.

(21) Appl. No.: 09/942,433

(22) Filed: Aug. 29, 2001

(65) Prior Publication Data

US 2002/0047791 A1 Apr. 25, 2002

(30) Foreign Application Priority Data

Aug. 29, 2000 (JP) ........................................ 2000-259232

(51) Int. Cl.$^7$ ................................................. H03M 1/66

(52) U.S. Cl. ........................................ 341/144; 341/155

(58) Field of Search .............................. 341/144, 155, 341/145, 156

(56) References Cited

U.S. PATENT DOCUMENTS 5,731,775 A * 3/1998 Gross, Jr. et al. ............ 341/155

OTHER PUBLICATIONS

Takeshi & Hara, "Basic of Integrated Circuit", pub. May 30, 1992, Kindai Kagakusha Co., Ltd. publishers, pp. 158–159 & 164–165. Handbook shows the basic concept for resistor string DA converter.

* cited by examiner

Primary Examiner—Peguy JeanPierre
Assistant Examiner—Joseph J Lauture
(74) Attorney, Agent, or Firm—Gray Cary Ware & Freidenrich LLP

(57) ABSTRACT

Considering that MOS transistors on a common integrated circuit can be controlled in resistance ratio between them with a relatively high accuracy, a DA converter is improved in accuracy by replacing resistors required to be accurate with MOS transistors without inviting an increase of the chip area. That is, between a high potential reference voltage (VrefH) and a low potential reference voltage (VrefL), a plurality of MOS transistors (M1-MN) are connected in series such that they normally operate in a linear region and at least one turns OFF during power-down periods of the DA converter. One of partial voltages (V1-VN) of these MOS transistors (M1-MN) is selected by switches (SW1-SWN) controlled in ON-OFF motion by a control signal obtained by decoding a digital input (12) in a decoder (11), and delivered to an analog output (13), such that an analog value corresponding to the digital data given from the digital input (12) is sent out from the analog output 13.

22 Claims, 8 Drawing Sheets

DA CONVERTER

CROSS-REFERENCE TO RELATED APPLICATIONS

This application is based upon and claims the benefit of priority from the prior Japanese Patent Applications No. 2000-259232, filed on Aug. 29, 2000; the entire contents of which are incorporated herein by reference.

FIELD OF THE INVENTION

This invention relates to a DA converter, and more particularly, to a circuit for dividing a voltage depending on resistance components of a device and converting an input digital data to an analog value.

BACKGROUND OF THE INVENTION

Various types of DA converter for converting digital data to analog values are known. Among them, those of the resistor string type and the R-2-R type using resistors are widely used as incorporated types in integrated circuits. They each have a configuration combining a plurality of resistors and a MOS transistor connected in series thereto such that the resistors are switched by switching elements controlled by a digital data, thereby to obtain a desire analog value.

In the configuration mentioned above, accuracy of resistors and characteristics of MOS transistors, such as ON resistance, large affect the accuracy of the analog output value. These parameters, however, vary independently from each other due to manufacturing fluctuation of integrated circuits. In general, therefore, they do not always exhibit designed values.

FIG. 4 is a circuit diagram that shows one of conventional DA converters, which has a resistor string type configuration connecting N resistors R1 through RN and a MOS transistor that are connected in series.

In the configuration of FIG. 4, resistors R1-RN have the function of dividing a voltage between a high potential reference voltage VrefH and a low potential reference voltage VrefL and generating analog voltages V1 through VN whereas the MOS transistor M1 plays the role of a switch that prevents a flow of a current from the high potential reference voltage VrefH to the low potential reference voltage VrefL and useless consumption of the power thereby while the DA converter is in rest. That is, when the DA converter is in rest, a power-down signal PDB maintains the drain current of the MOS transistor M1 substantially zero to prevent consumption of the current.

A digital input 12 is converted by a decoder 11 to a selection signal corresponding to the digital data, and one of switches SW1 through SWN associated with analog voltages V1-VN is selected. As a result, one of analog voltages V1-VN is selected and output as the analog output 13. Switches SW1-SWN can be realized by using MOS transistors.

Let all of resistance values of respective resistors R1-RN be Rr and let the ON resistance of the MOS transistor M1 be Ron. Then, the full scale voltage of the DA converter is $$(VrefH-VrefL) \times Rf \times N/(Rr \times N + Ron) \quad (1)$$

In order to ensure that the full scale voltage is constant without manufacturing fluctuation among integrated circuits, it is necessary to design the ON resistance Ron to be sufficiently smaller than resistance Rr×N. To design the ON resistance Ron to be small, ratio of the channel width of the MOS transistor is required to be large relative to the channel length. This directly invites an increase of the chip area.

On the other hand, to ensure a high operating frequency of the DA converter, the time constant of the circuit itself has to be small. In this case, the resistance value of the resistors R1-RN must be small. For this purpose, ON resistance Ron of the MOS transistor M1 is required to be additionally smaller, which is an additional factor leading to a further increase of the chip area.

FIG. 5 is a circuit diagram that shows another conventional DA converter configured to divide a digital input signal to higher-order bits and lower-order bits and combine two DA converter blocks, one for higher-order bits and the other for lower-order bits.

In the configuration of FIG. 5, resistors RM1-RMN have function of dividing a voltage between a high potential reference voltage VrefH and a low potential reference voltage VrefL and generating analog voltages V1-VN whereas the MOS transistor M1 plays the role of a switch that prevents a flow of a current from the high potential reference voltage VrefH to the low potential reference voltage VrefL and thereby prevents useless consumption of the power while the DA converter is in rest. That is, when the DA converter is in rest, a power-down signal PDB maintains the drain current of the MOS transistor M1 substantially zero to prevent consumption of the current.

Connected to low-potential terminals of the resistors RM1-RMN-1 are MOS transistors MA1-MAN-1 that are selectively turned ON by selection signals Vg-VgN-1, and drain output is a secondary high potential reference voltage VH.

On the other hand, connected to low-potential terminals of the resistors M2-RMN are MOS transistors MB1-MBN-1 that are selectively turned ON by selection signals Vg1-VgN-1, and the drain output is a secondary low potential reference voltage VL.

A digital input 23 of the block of higher-order bits is converted to a selection signal Vg1-VgN-1 corresponding to the digital data by a decoder 21, and it is given to a MOS transistor MA1-MAN-1 and a MOS transistor MB1-MBN-1. As a result, a corresponding MOS transistor is turned ON. This results in the high-potential voltage of one of resistors RM2-RMN being selected and output as the secondary high potential reference voltage VH and the low-potential voltage of same being selected and output as the secondary low potential reference voltage VL.

The resistors RL1 through RLM have the function of dividing a voltage between the secondary high potential reference voltage VH and the secondary low potential reference voltage VL and generating analog voltages VL1-VLM.

A digital input 24 to the block of lower-order bits is converted to a selection signal corresponding to the digital data by a decoder 22, and one of switches SW1-SWM associated with respective analog voltages VL1-VLM is selected. As a result, one of analog voltages VL1-VLM is selected and output as the analog voltage value output 25. Switches SW1-SWM can be realized by using MOS transistors.

In summary, the DA converter having the configuration of FIG. 5 selects a voltage range which is data of a higher-order bit, and selects and outputs to the analog output 25 one of analog voltage values obtained by further dividing the selected voltage range with data of a lower-order bit.

For improving the accuracy of this circuit, it is necessary to maintain the ON resistance of MOS transistors MA1-MAN-1 and MOS transistors MB1-MBN-1 sufficiently smaller than the total of resistance values of resistors RL1-RLM of lower-order bits. For this purpose, the ratio of the channel width relative to the channel length must be large, that is, the channel width must be wider, and this inevitably increases the area occupied on an integrated circuit.

FIG. 6 is a circuit diagram that shows a still further conventional DA converter having a R-w-R type configuration.

As apparent from FIG. 6 as well, this DA converter is made up of resistors RC1-RCN-1, RD0-RDN and MOS transistors MD1-MDN and MD1B-MDNB.

MOS transistors MD1-MDN are each controlled by a signal VgD1-VgDN corresponding to digital inputs 31. On the other hand, MOS transistors MD1B-MDNB are controlled by signals VgD1B-VgDNB which are inversion signals of signals VgD1-VgDN. That is, they are so controlled that, while one is ON, the other is OFF, or while one is OFF, the other is ON, in each of associated pairs of MOS transistors MD1-MDN and MOS transistors MD1B-MDNB.

MOS transistors MD1-MDNB are connected to the high potential reference voltage VrefH whereas MOS transistors MD1B-MDNB are connected to the low potential reference voltage VrefL. Depending on a ON-OFF combination corresponding to the digital inputs 31, the high potential reference voltage VrefH or the low potential reference voltage VrefL is supplied to a connection point of serially connected resistors RD0, resistors RC1-RCN-1 through corresponding one of resistors RD1-RDN.

In the circuit of FIG. 6, when disregarding the ON resistance of each MOS transistor and setting the resistance of RDO-RDN to a value twice that of RC1-RCN-1, an analog value linearly responsive to the digital data from the digital inputs 31 should have been output to the analog output 32 in the calculated value. Actually, however, linearity is obtained by intentional adjustment taking account of ON resistance values of MOS transistors such that, when the resistance value of RC1-RCN-1 is Rr, the sum of the resistance value of RD1-RDN and the ON resistance value Ron of each MOS transistor becomes the resistance value 2Rr.

Actually, however, it is difficult to maintain a constant ratio between the ON resistance values Ron and the resistance values of the resistors. Practically, therefore, it is indispensable to design the MOS transistors to have sufficiently small ON resistance values Ron relative to the resistance values of the resistors such that any change in ratio does not affect the property of the DA converter. As a result, it is necessary to employ a large channel width of each MOS transistor relative to the channel length, and an increase of the occupied chip area is inevitable.

In the configurations of FIGS. 4, 5 and 6 that shows conventional configurations, NMOS transistors are employed as MOS transistors. However, even when they are PMOS transistors, or parallel connection of NMOS and PMOS transistors controlled by gate signals VgN and VgP as shown in FIG. 7, it is still necessary to employ a large channel width of each MOS transistor for reducing the ON resistance, and a corresponding chip area will be occupied.

As discussed above, because of configurations of realizing the function of a DA converter by combining a series of resistors and a MOS transistors on an integrated circuit, the conventional semiconductor devices could not accurately control the ratio of resistance values of the resistors and the ON resistance of the MOS transistor, and they were therefore compelled to design the MOS transistor to have a relatively low ON resistance, which inevitably increased the chip area of the integrated circuit.

Moreover, it is necessary to reliably cut off the high potential side and the low potential side of the power source, for example, to be isolated in voltage from each other, and it is important from viewpoints of the layout of wirings and other circuit designs to determine which element in which position should be used for the blocking. Furthermore, the blocking must be more reliable, and there arises the problem where the blocking element should be placed in positional relations with the high voltage side and the low voltage side of the power source, for example, and whether the element alone is sufficient for complete blocking.

BRIEF SUMMARY OF THE INVENTION

It is therefore an object of the invention to overcome the problems involved in the conventional techniques and provide a DA converter replacing a series of resistors required to be highly accurate with transistors, noting that transistors can be controlled in resistance ratio therebetween with a relatively high accuracy on a common integrated circuit, and therefore capable of improving the accuracy of division of a voltage without increasing the chip area, having a margin in its circuit design, and capable of reliably cutting the voltage-dividing circuits.

To attain the object, according to an embodiment of the invention, there is provided a DA converter for dividing a reference voltage and outputting a partial voltage corresponding to an input digital data, comprising:

a set of resistive elements connected to the reference voltage and made up of serially connected resistive elements which are made of transistors, any number of the transistors at any position being usable for cutting the circuit off; and a partial voltage extracting circuit for having a partial voltage corresponding to the input digital data be output from the set of resistive elements.

To attain the object, according to another embodiment of the invention, there is provided a DA converter for dividing a reference voltage and outputting a partial voltage corresponding to an input digital data, comprising:

a first set of resistive elements connected to the reference voltage, having a plurality of serially connected first resistive elements;

a first partial voltage extracting circuit for outputting a first partial voltage corresponding to one part of the input digital data be output from the first set of resistive elements;

a second set of resistive elements connected to the first partial voltage and having a plurality of serially connected second resistive elements; and a second partial voltage extracting circuit for outputting a second partial voltage corresponding to the other part of the input digital data be output from the second set of resistive elements.

To attain the object, according to another embodiment of the invention, there is provided a DA converter for outputting a reference voltage as a partial voltage corresponding to an input digital data from an output end, comprising:

a first set of resistor elements including a plurality of resistive elements connected in series between a first reference voltage and the output end;

a first set of transistors including a plurality of first transistors each functioning as a switch and as a resistive element in the ON state thereof, each the first transistor being connected at one end to the first reference voltage and at the other end to one end of predetermined one of the resistive elements; and a second set of transistors including a plurality of second transistors each functioning as a switch and as a resistive element in the ON state thereof, each the second transistor being connected at one end to the second reference voltage and at the other end to the other end of associated one of the first transistors, each the first transistor and associated one of the second transistors being controlled such that one of them turns ON whereas the other turns OFF, depending on the digital input.

To attain the object, according to another embodiment of the present invention, there is provided a DA converter for dividing a reference voltage and outputting a partial voltage corresponding to an input digital data providing a plurality of DA converter units serially connected to the reference voltage, each the DA converter, comprising:

a first set of resistive elements connected to the reference voltage and having a plurality of serially connected first resistive elements;

a first partial voltage extracting circuit for having a first partial voltage corresponding to one part of the input digital data be output from the first set of resistive elements;

a second set of resistive elements connected to the first partial voltage and having a plurality of serially connected second resistance elements; and a second partial voltage extracting circuit for having a second partial voltage corresponding to the other part of the input digital data be output from the second set of resistive elements.

DETAILED DESCRIPTION OF THE INVENTION

Embodiments of the invention will now be explained below with reference to the drawings.
First Embodiment FIG. 1 is a circuit diagram that shows a DA converter taken as the first embodiment of the invention, which is of a resistor-string type using N pieces of MOS transistors M1-MN in series.

Figure 1:
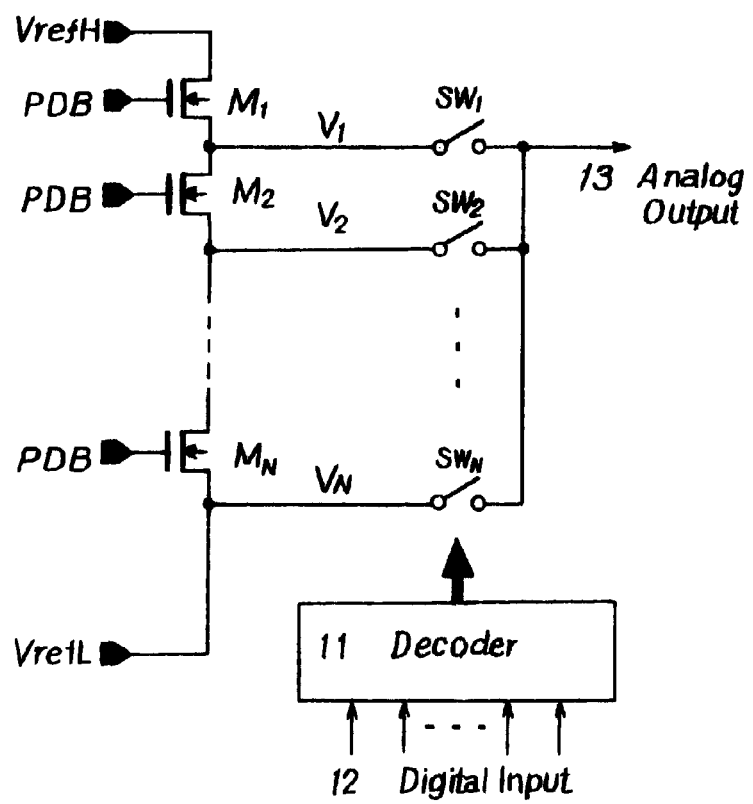
FIG. 1 is a circuit diagram of a DA converter according to the first embodiment of the invention.

In the configuration of FIG. 1, MOS transistors M1-MN have gates supplied with a voltage to activate them in a linear region, and are adjusted to have a specific ON resistance value. In this case, it is important that all of the MOS transistors are uniform in ON resistance value than in absolute value of the ON resistance value. This can be easily controlled because all MOS transistors are arranged on a common chip.

These MOS transistors M1-MN have the function of dividing a voltage between a high potential reference voltage VrefH and a low potential reference voltage VrefL and generating analog voltages V1-VN. Each of the MOS transistors M1-MN also has the function of a switch for preventing a flow or a current from the high potential reference voltage VrefH to the low potential reference voltage VrefL and thereby preventing useless consumption of the power while the DA converter is in rest. Thus, when the DA converter is in rest, a power-down signal PDB maintains the drain current of all MOS transistors M1-MN substantially zero and prevents consumption of the current.

A digital input 12 is converted by a decoder 11 to a selection signal corresponding to the digital data, and one of switches SW1 through SWN associated with analog voltages V1-VN is selected. As a result, one of analog voltages V1-VN is selected and output as the analog output 13. Switches SW1-SWN can be realized by using MOS transistors.

Let all of resistance values of respective resistors M1-MN be Rr. Then, the full scale voltage of the DA converter is $$(VrefH-VrefL) \times Rr \times N/(Rr \times N) \qquad (2)$$

and it is constant regardless of the value Rr of the ON resistance. Even when the manufacturing fluctuation among integrated circuits is taken into consideration, since it is not difficult to uniform the MOS transistors in property to be substantially equal in ON resistance, the full scale voltage remains constant.

As explained above, since the configuration according to the first embodiment can maintain the full scale voltage affecting the accuracy of the DA converter constant without reducing the ON resistance of the MOS transistors, and therefore increases the accuracy of the analog voltage value output 13.

Although the first embodiment has been explained as turning off all MOS transistors during inactivation of the DA converter by giving the power-down signal PDB to all MOS transistors M1-MN, the current can be blocked also by giving the power-down signal PDB to only one of the MOS transistors, and the same effect will be obtained.

As explained above, since the first embodiment employs MOS transistors M1-MN having specific resistance values in a linear region as voltage-dividing resistors arranged in series between the high potential reference voltage VrefH and the low potential reference voltage VrefL, it can make all or part of the MOS transistors function to block the current during the power-down period of the DA converter, which enables omission of power-down MOS transistors heretofore indispensable for realizing a low ON resistance value and having occupied a significant part of the chip area. Therefore, the embodiment is effective for reducing the number of elements and reducing the chip area. In addition, also when raising the operating frequency of the DA converter, it is sufficient to reduce the time constant of the circuit itself, taking only the ON resistance value of the MOS transistors M1-MN into consideration, and no attention has to be paid to power-down MOS transistors heretofore having the need of relatively reducing the ON resistance. Therefore, the embodiment can alleviate factors of increasing the chip area toward improvement of frequency.

Furthermore, when cutting the high voltage side and the low voltage side of the power source (high potential or low potential reference voltages VrefH, VrefL) from each other, any MOS transistor M1-MN located at a desired position can be used. In addition, for such cutting, one of, or any number of, transistors M1-MN can be used. In this manner, the cutting will be more reliable regardless of the magnitude of the potential difference between the high voltage side power source and the low voltage side power source. That is, in case the series of transistors are made up of Nch type MOS transistors, one close to the high voltage side may be used for cutting. In case they are made up of Pch type MOS transistors, one close to the low voltage side may be used for cutting. Thus a reliable cutting effect is expected. If a plurality of transistors are used for cutting instead of using only one, the cutting effect can be made substantially perfect. In case the circuit of FIG. 1 is incorporated into another circuit, it is important whichever position one or more transistors for cutting are selected, from the viewpoints of minimizing the wirings, saving the space, minimizing the parasitic capacitance, and so on. Since any transistor in any position is usable for cutting in the circuit of FIG. 1, this circuit is useful from those viewpoints. This advantage is similarly given also by the circuits of FIGS. 2 and 3, which will be explained below.

Second Embodiment

Figure 2:
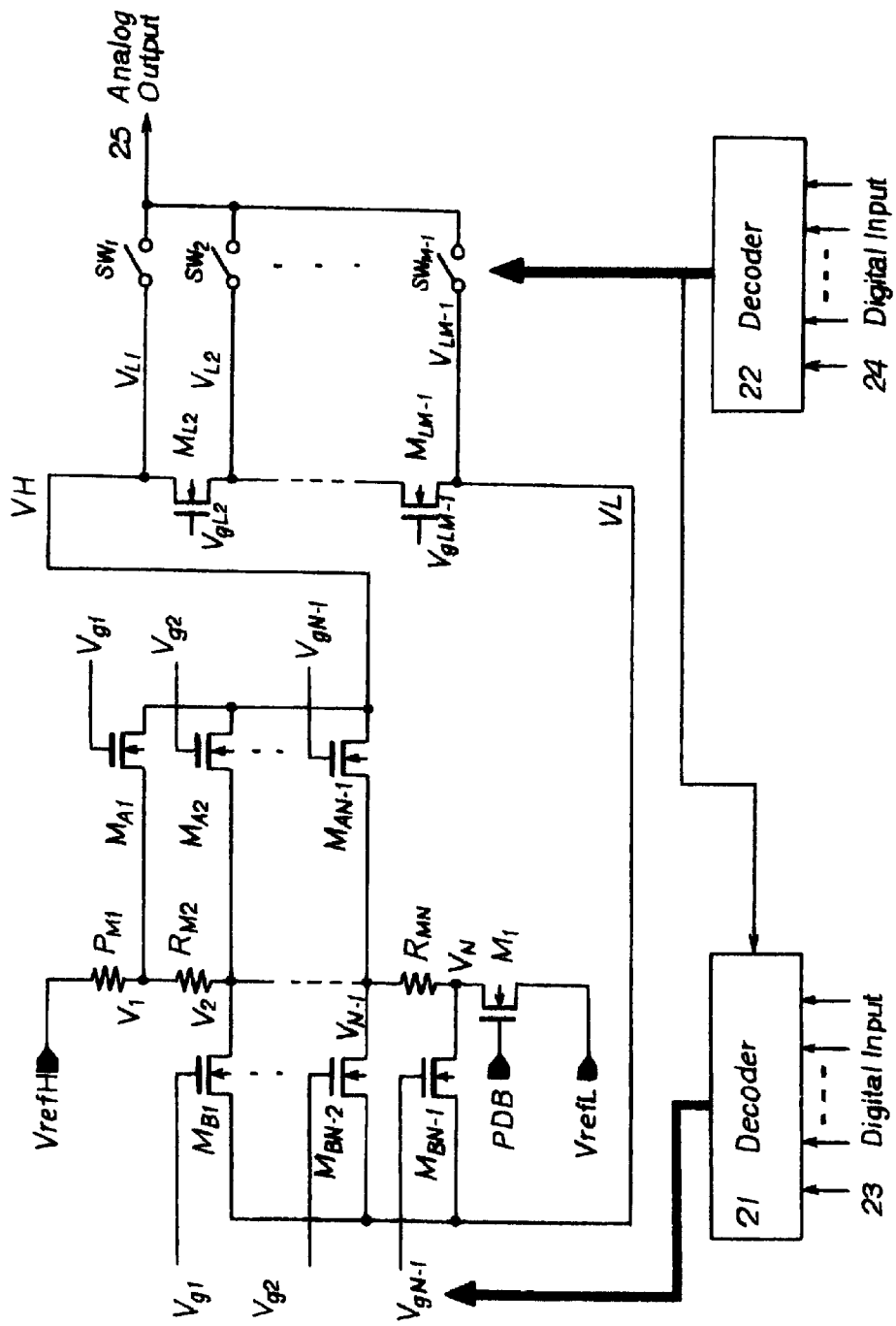
FIGS. 2, 2A and 2B are circuit diagrams of different type DA converters, according to the second embodiment of the invention.

FIG. 2 is a circuit diagram of a DA converter taken as the second embodiment of the invention, which has a configuration dividing the digital input signal to higher-order bits and lower-order bits and combining two DA converter blocks, one for the higher-order bits and the other for the lower-order bits.

In the configuration of FIG. 2, resistors RM1-RMN have the function of dividing a voltage between a high potential reference voltage VrefH and a low potential reference voltage VrefL and generating analog voltages V1-VN. A MOS transistor M1 plays the role as a switch for preventing a flow of a current from the high potential reference voltage VrefH to the low potential reference voltage VrefL and thereby preventing AWL useless consumption of the power while the DA converter is in rest. That is, when the DA converter is in rest, a power-down signal PDB maintains the drain current of the MOS transistor M1 substantially zero, and prevents consumption of the current.

Connected to higher-potential terminals of the respective resistors RM1-RMN are MOS transistors MA1-MAN-1 that are selectively turned ON by selection signals Vg1-VgN-1, and their drain output is used as a secondary high potential reference voltage VH.

On the other hand, connected to lower potential terminals of the respective resistors RM1-RMN are MOS transistors MB1-MBN-1 that are selectively turned ON by selection signals Vg1-VgN-1, and their drain output is used as a secondary low potential reference voltage VL.

A digital input 23 to the block of higher-order bits is converted to a selection signal Vg1-VgN-1 corresponding to the digital data by a decoder 21, and it is given to MOS transistors MA1-MAN-1 and MOS transistors MB1-MBN-1. As a result, a corresponding MOS transistor is turned ON. Accordingly, the higher-potential voltage of one of the resistors RM2-RMN is selected and output as the secondary high potential reference voltage VH whereas the lower-potential voltage thereof is selected and output as the secondary low potential reference voltage VL.

MOS transistors ML2-MLM-1 have the function of dividing a voltage between the secondary high potential reference voltage VH and the secondary low potential reference voltage VL and generating analog voltages VL1-VLM-1. Gates of the respective MOS transistors ML2-MLM-1 are supplied with control voltages VgL2-VgLM-1 having them operate in a linear region.

A digital input 24 to the block of lower-order bits is converted to a selection signal corresponding to the digital data by a decoder 22, and one of switches SW1-SWM-1 associated with respective analog voltages VL1-VLM-1 is selected. As a result, one of analog voltages VL1-VLM-1 is selected and output as the analog voltage value output 25. Switches SW1-SWM-1 can be realized by using MOS transistors.

That is, the DA converter having the configuration of FIG. 2 selects a voltage range that is data of higher-order bits, and selects an analog voltage value made by further dividing the selected voltage range with data of lower-order bits, such that it is output to the analog output 25.

In this circuit, both the MOS transistors MA1-MAN-1 and the MOS transistors MB1-MBN-1 controlled by control signals Vg1-VgN-1 are designed to operate in a linear region, that is, to turn ON with a certain resistance value. Therefore, the circuit needs no MOS transistor corresponding to the switch, which was conventionally provided in association with the secondary high potential reference voltage VH or secondary low potential reference voltage VL, and can save the chip area.

In case a voltage of output voltages VL1-VLM-1 is output to the analog output 25, MOS transistors ML2-MLM-1 are operated in a linear region. In case a voltage of voltages V2-VN is output to the analog output 25, the switch SWM-1 is turned ON, and at least one of MOS transistors ML2-MLM-1 is turned OFF. In this manner, a desired analog output voltage V2-VN can be obtained.

In the circuit according to the second embodiment, since the voltage applied to the circuit for dividing the voltage with the ON resistance of the MOS transistor is relatively small, the full scale voltage of the block of lower-order bits always becomes smaller than the full scale voltage of the DA converter. As a result, the circuit can decrease voltage differences between gates and the sources of MOS transistors ML2-MLM-1, MOS transistors MA1-MAN-1 and MOS transistors MB1-MBN-1.

Also this embodiment can diminish the MOS transistors MA1-MAN-1 and MOS transistors MB1-MBN-1 in size, which were inevitably large-scaled in conventional techniques. Therefore, it is possible to reduce the chip area while maintaining a high accuracy as a DA converter.

In the second embodiment, resistors RM1-RMN and power-down MOS transistor M1 remain untouched. However, needless to say, the chip area can be further reduced by replacing the resistors with MOS transistors and omitting the power-down transistor similarly to the first embodiment.

In FIG. 2, the example is shown as using the first stage as the set of resistors and using the second stage as the set of MOS transistors. Instead, however, any number of stages may be provided as sets of voltage-dividing transistors, and they may be connected in series.

In FIG. 2, a DA converter unit providing a resistance unit of resistances RM1-RMN, connected between the high and low potential reference voltages, is explained. In stead of the above structure, it is possible to employ a structure that a plurality of DA converter units are connected in series between the high and low potential reference voltages. Examples of this case are shown in FIGS. 2A and 2B.

Figure 2A:
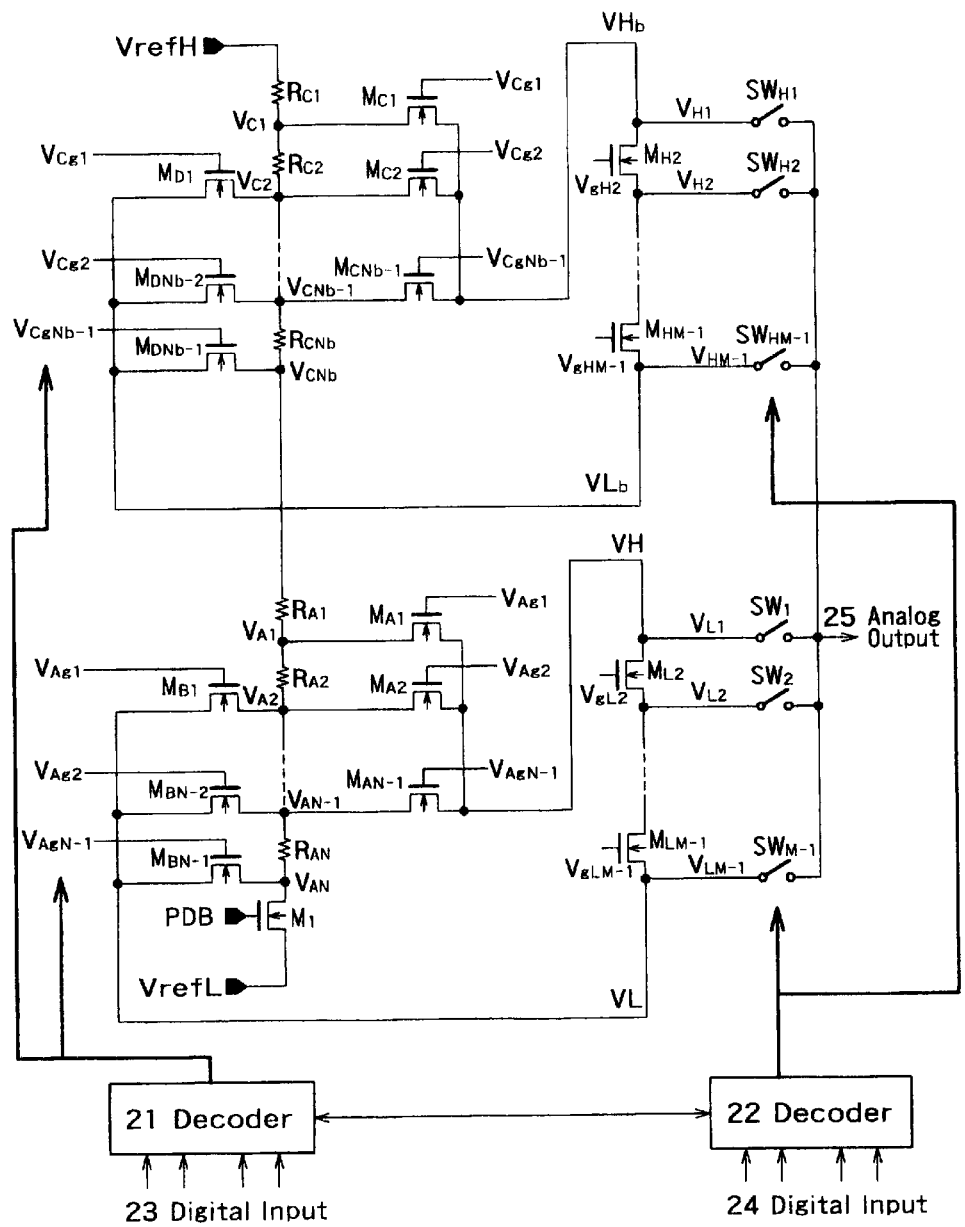
Figure 2B:
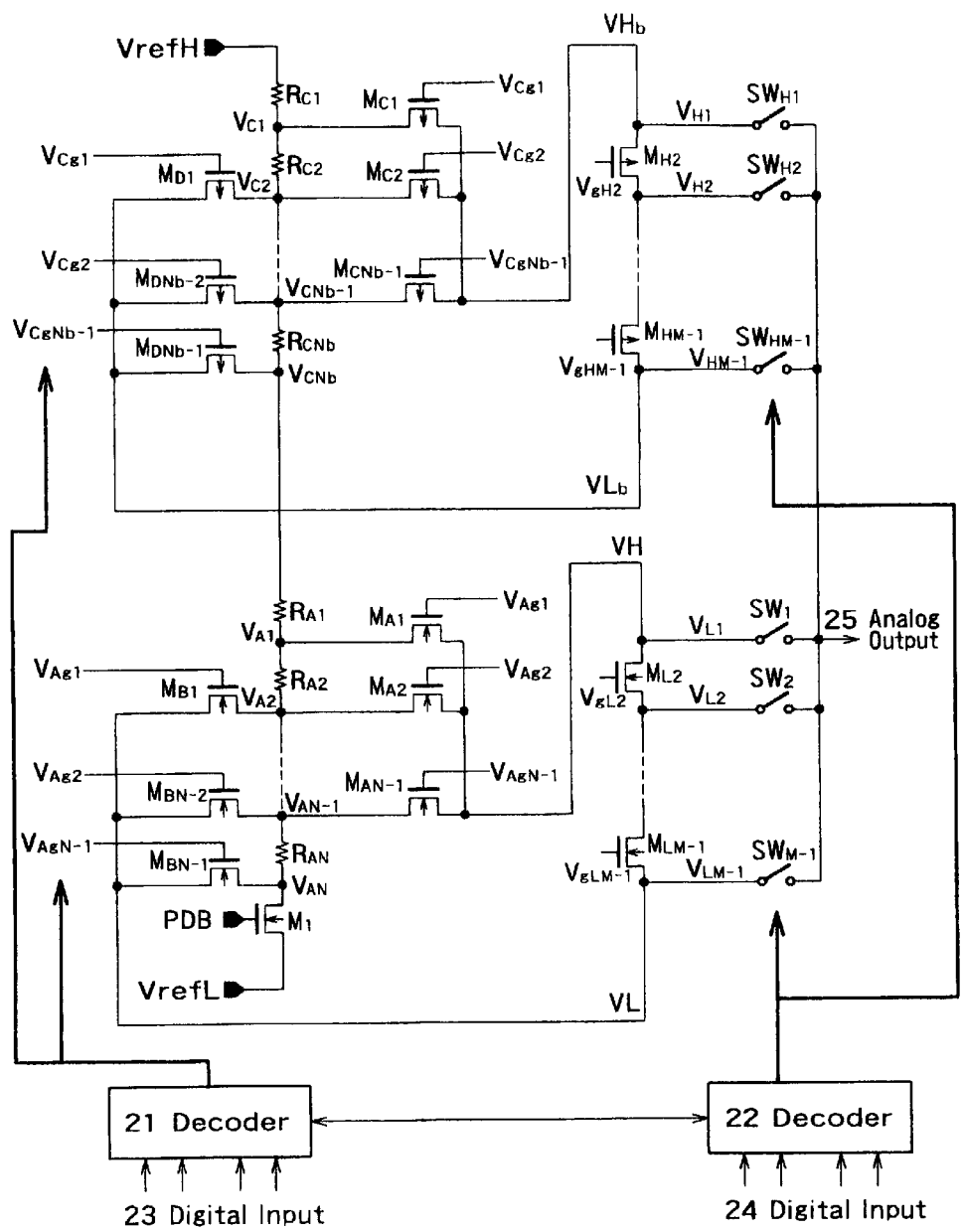

The difference points of FIG. 2B from FIG. 2A are that MOS transistors MCi connected to resistance RCi of the high potential reference voltage VrefH side are P-channel type MOS transistors. Other points of FIG. 2B are substantially similar to FIG. 2A.

In the DA converters of FIGS. 2A and 2B, two resistance units are provided. Therefore, it is possible that two independent MOS transistor switch groups are employed in upper and lower resistance units. For example, it is possible that threshold values, sizes and driving abilities and so on of the upper and lower switch groups are set at different values independently. Herewith a flexibility of design increases to easily construct systems according to various requirements. Furthermore, in FIG. 2B, P and N channel types MOS transistors are used. As a result, it is possible to efficiently use the voltage between the high and low potential reference voltages.

Third Embodiment

Figure 3:
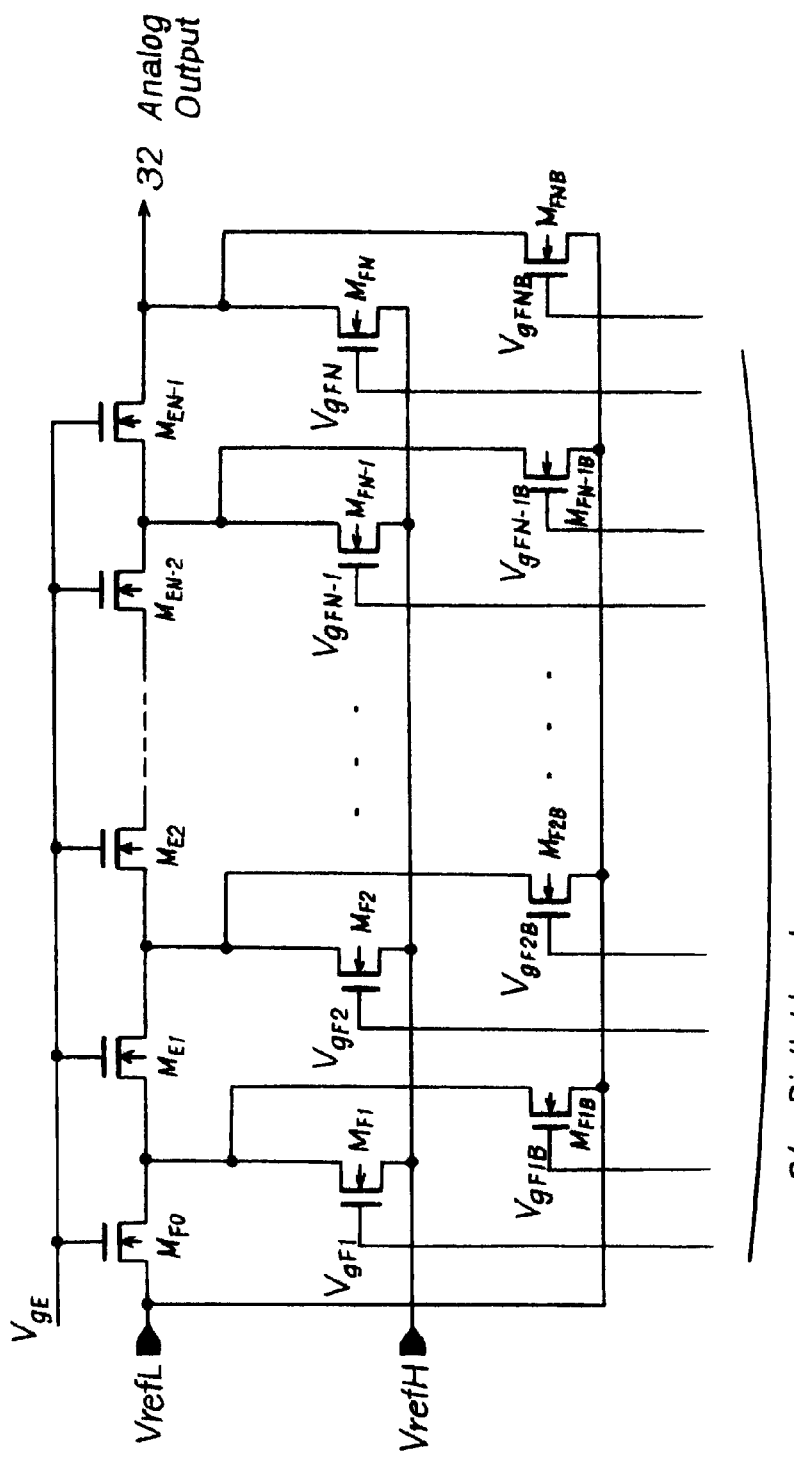
FIG. 3 is a circuit diagram of a DA converter according to the third embodiment of the invention.
Figure 4:
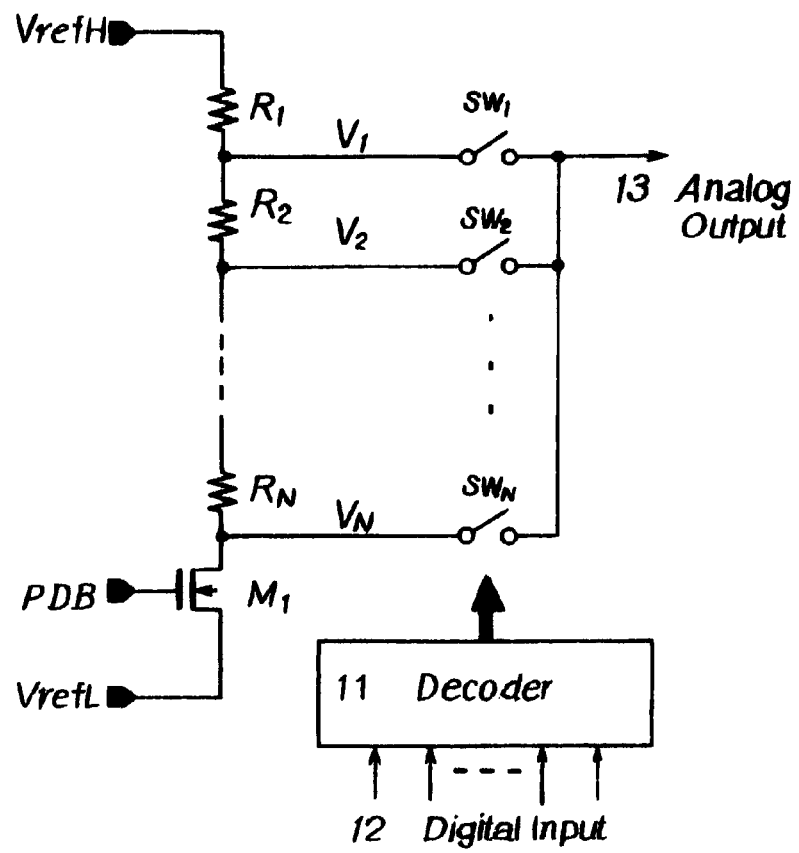
FIG. 4 is a circuit diagram of a conventional DA converter.
Figure 7:
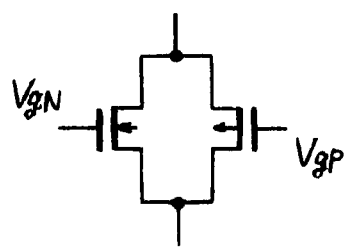
FIG. 7 is a circuit diagram that shows an example of switches made up of MOS transistors.
Figure 5:
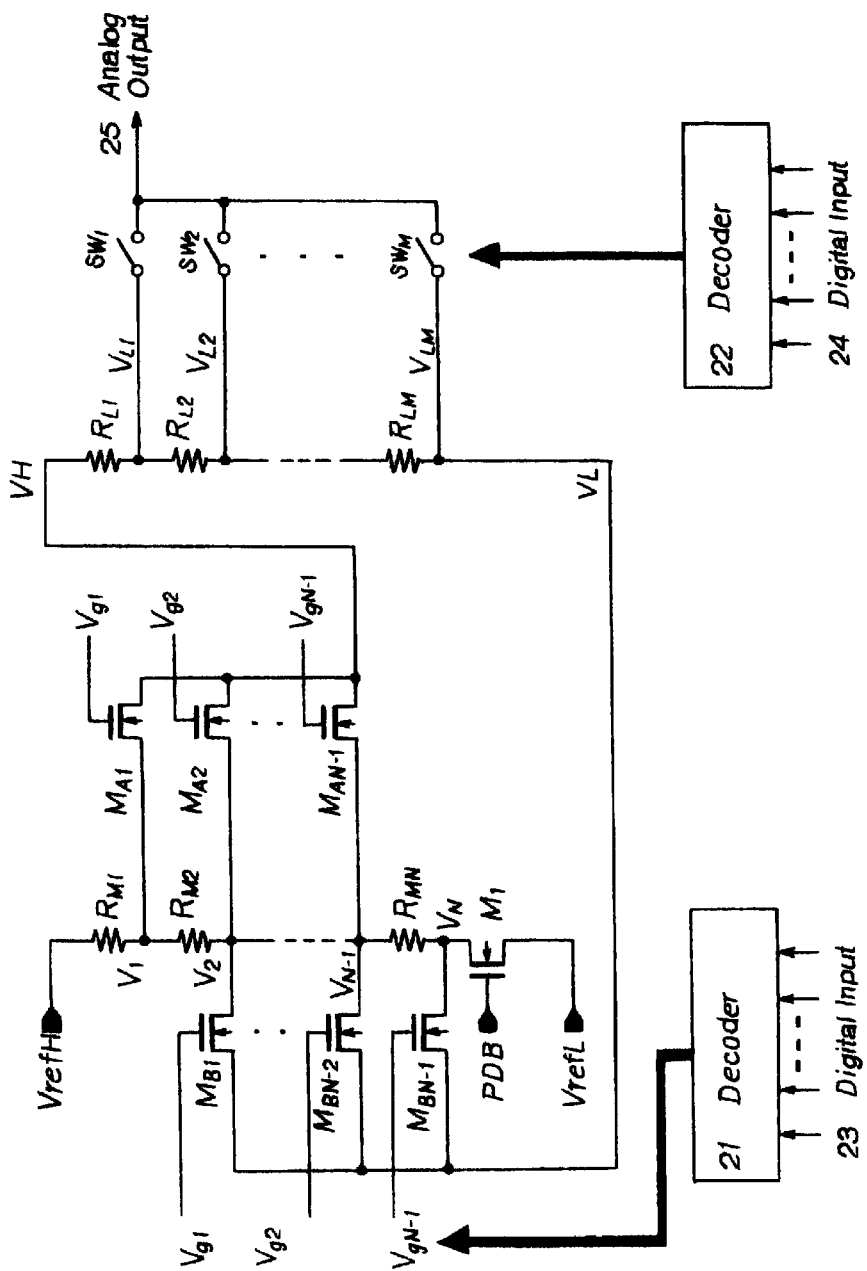
FIG. 5 is a circuit diagram of another conventional DA converter.
Figure 6:
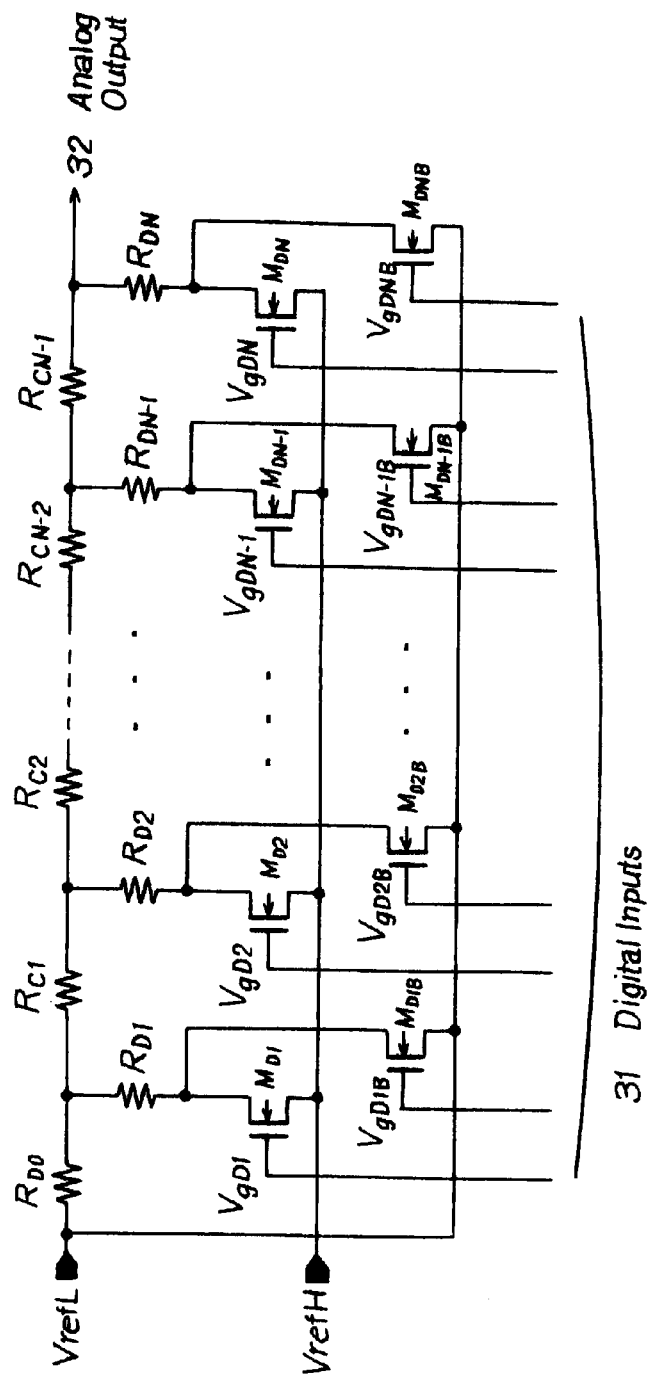
FIG. 6 is a circuit diagram of still another conventional DA converter.

FIG. 3 is a circuit diagram of a DA converter taken as the third embodiment of the invention, which has a R-2-R type configuration.

As apparent from FIG. 3, this DA converter is so configured that serial MOS transistors MF0, ME1-MEN-1 supplied with a gate control voltage VgE operate in a linear region and MOS transistors MF1-MFN, MF1B-MFNB controlled by digital inputs 31 operate in a linear region when turned ON.

MOS transistors MF1-MFN are controlled by signals VgF1-VgFN corresponding to the digital inputs 31. On the other hand, MOS transistors MF1B-MFNB are controlled by signals VgF1B-VgFNB that are inversion signals of signals VgF1-VgFN. That is, MOS transistors MF1-MFN and MOS transistors MF1B-MFNB are so controlled that, while one is ON, the other is OFF, or while one is OFF, the other is ON, in each of associated pairs thereof.

MOS transistors MF1-MFN are connected to a high potential reference voltage VrefH whereas MOS transistors MF1B-MFNB are connected to a low potential reference voltage VrefL. Depending on a ON-OFF combination corresponding to the digital inputs 31, the high potential reference voltage VrefH or the low potential reference voltage VrefL is supplied to a connection point of serially connected MOS transistors MF0, ME1-MEN-1 with the ON resistance thereof.

In the circuit of FIG. 3, when ON resistance values of MOS transistors MF0-MFN and MOS transistors MF1B-MFNB are set twice the ON resistance values of MOS transistors ME1-MEN-1, an analog value linearly responsive to the digital data from the digital inputs 31 is output to the analog output 32 in the calculated value.

In the third embodiment, since the characteristics are determined solely by ratios of ON resistance values of all MOS transistors, it is not necessary to use large-scaled MOS transistors and thereby reduce the ON resistance values. In addition, since all MOS transistors controlled by the digital inputs 31 function as switches and resistors, the embodiment can reduce the number of elements as compared with conventional techniques, and it is effective for reducing the total chip area.

Furthermore, the embodiment makes it possible to make up the circuit with MOS transistors equal in property, it is effective also for improving the accuracy as the DA converter.

Also in the first and second embodiments, transistors M1-MN (FIG. 1) and transistors ML2-MLM-1 (FIG. 2) can be configured such that partial voltages depend upon ratios of properties of respective transistors.

As described above, in the DA converter according to the invention, since the set of resistors and switching elements conventionally made up of combinations of resistors and MOS transistors are wholly or partly replaced by transistors operative in a linear region, their properties can be equalized relatively easily in the integrated circuit process, and accuracy can be ensured without using large-scaled transistors having small ON resistance values. Additionally, by making the best use of functions of transistors as switches and as resistors, functions of a switching element and a resistive element conventionally provided separately can be put together into a single transistor, and this is effective for reducing the number of elements and the chip area. Furthermore, since the voltage-dividing resistors are made up of MOS transistors, these transistors can be used also to cut off the high voltage side potential and the low voltage side potential as voltage-dividing potentials from each other. The transistor may be any in any position of the set of the transistors, a transistor minimizing the length of wiring can be used for cutting when making and connecting wirings for applying a shut-off controlling signal. As a result, it is possible not only to increase the margin for circuit design but also to decrease the parasitic capacitance, or the like, to improve the property. Moreover, not limited to only one, any desired number of transistors may be used for cutting to ensure more reliable cutting.

What is claimed is:

1. A DA converter for dividing a reference voltage and outputting a partial voltage corresponding to an input digital data, comprising:

a set of resistive elements connected to said reference voltage and made up of serially connected resistive elements which are made of transistors, any number of said transistors at any position being usable for cutting the circuit off; and a partial voltage extracting circuit for having a partial voltage corresponding to said input digital data be output from said set of resistive elements.

2. A DA converter according to claim 1 wherein said transistors are arranged on a common chip.

3. The DA converter according to claim 1 wherein said transistors are MOS transistors having a specific resistance value at the ON state.

4. A DA converter according to claim 3 wherein each said transistor is an N-channel type transistor, and any number of said transistors at higher voltage sides are used for cutting the circuit off.

5. A DA converter according to claim 3 wherein each said transistor is a P-channel type transistor and any number of said transistors at lower voltage sides are used for cutting the circuit off.

6. A DA converter according to claim 1 wherein said partial voltage extracting circuit includes a plurality of switches each connected to one end of each said transistor, and one of said switches is closed depending on said input digital data such that said partial voltage is output.

7. A DA converter according to claim 6 wherein said switch is a MOS transistor.

8. A DA converter for dividing a reference voltage and outputting a partial voltage corresponding to an input digital data, comprising:

a first set of resistive elements connected to said reference voltage, having a plurality of serially connected first resistive elements;

a first partial voltage extracting circuit for outputting a first partial voltage corresponding to one part of said input digital data be output from said first set of resistive elements;

a second set of resistive elements connected to said first partial voltage and having a plurality of serially connected second resistive elements, said second resistive elements being transistors; and a second partial voltage extracting circuit for outputting a second partial voltage corresponding to the other part of said input digital data be output from said second set of resistive elements.

9. A DA converter according to claim 8 wherein said first partial voltage extracting circuit includes a plurality of first partial voltage switches each connected to one end of any one of said first resistive elements, and one of said first partial voltage switches is closed depending on one part of said input digital data such that said first partial voltage is output, the other ends of said first partial switches being commonly connected to one end of said second set of resistive elements, wherein said second partial voltage extracting circuit includes second partial voltage switches each connected to one end of any one of said second resistive elements, and one of said second partial voltage switches is closed depending on the other part of said input digital data such that said second partial voltage is output.

10. A DA converter according to claim 9 wherein said first partial voltage switches are MOS transistors.

11. A DA converter according to claim 9 wherein said first partial voltage extracting circuit further includes a plurality of first switches, one end of each first switch being commonly connected to said other end of said second set of resistive elements, the other end of each said first switch being connected to one end of predetermined one of said first resistive elements in said first set of resistive elements, said first switches being selectively controlled conductive by one part of said input digital data.

12. A DA converter according to claim 9 wherein said first partial voltage switches, said first switches and second resistive elements are MOS transistors arranged on a common chip.

13. A DA converter according to claim 12 wherein said second partial voltage switches are MOS transistors.

14. A DA converter according to claim 12 wherein said first partial voltage switches, said first switches and second resistive elements are MOS transistors having a specific resistance value at the ON state.

15. A DA converter according to claim 14 wherein each said transistor is an N-channel type transistor, and any number of said transistors at higher voltage sides are used for cutting the circuit off.

16. A DA converter according to claim 14 wherein each said transistor is a P-channel type transistor, and any number of said transistors at lower voltage sides are used for cutting the circuit off.

17. A DA converter for outputting a reference voltage as a partial voltage corresponding to an input digital data from an output end, comprising:

a first set of resistor elements including a plurality of resistive elements connected in series between a first reference voltage and said output end, said resistive elements being transistors;

a first set of transistors including a plurality of first transistors each functioning as a switch and as a resistive element in the ON state thereof, each said first transistor being connected at one end to said first reference voltage and at the other end to one end of predetermined one of said resistive elements; and a second set of transistors including a plurality of second transistors each functioning as a switch and as a resistive element in the ON state thereof, each said second transistor being connected at one end to a second reference voltage and at the other end to the other end of associated one of said first transistors, each said first transistor and associated one of said second transistors being controlled such that one of them turns ON whereas the other turns OFF, depending on said digital input.

18. A DA converter according to claim 17 wherein said resistive elements, said first transistors and said second transistors are MOS transistors and arranged on a common chip.

19. A DA converter for outputting a reference voltage as a partial voltage corresponding to an input digital data from an output end, comprising:

a first set of resistor elements including a plurality of resistive elements connected in series between a first reference voltage and said output end;

a first set of transistors including a plurality of first transistors each functioning as a switch and as a resistive element in the ON state thereof, each said first transistor being connected at one end to said first reference voltage and at the other end to one end of predetermined one of said resistive elements; and a second set of transistors including a plurality of second transistors each functioning as a switch and as a resistive element in the ON state thereof, each said second transistor being connected at one end to a second reference voltage and at the other end to the other end of associated one of said first transistors, each said first transistor and associated one of said second transistors being controlled such that one of them turns ON whereas the other turns OFF, depending on said digital input, wherein resistance value of each said resistive element and ON resistance of each said first transistor are equally adjusted to a first resistance value, and each said second transistor has a second resistance value, said first resistance value being adjusted to approximately one half of said second resistance value.

20. A DA converter for dividing a reference voltage and outputting a partial voltage corresponding to an input digital data providing a plurality of DA converter units serially connected to said reference voltage, each said DA converter, comprising:

a first set of resistive elements connected to said reference voltage and having a plurality of serially connected first resistive elements;

a first partial voltage extracting circuit for having a first partial voltage corresponding to one part of said input digital data be output from said first set of resistive elements;

a second set of resistive elements connected to said first partial voltage and having a plurality of serially connected second resistance elements, said second resistance elements being transistors; and a second partial voltage extracting circuit for having a second partial voltage corresponding to the other part of said input digital data be output from said second set of resistive elements.

21. A DA converter according to claim 20 wherein said first partial voltage extracting circuit and second set of resistive elements include MOS transistors, said MOS transistors of DA converter units are same channel type transistors.

22. A DA converter according to claim 20 wherein said first partial voltage extracting circuit and second set of resistive elements include MOS transistors, said MOS transistors of one of DA converter units and said MOS transistors of another of DA converter units are different channel type transistors.

* * * * *